(12) United States Patent
Csato et al.

(10) Patent No.: US 12,368,047 B2
(45) Date of Patent: Jul. 22, 2025

(54) METHOD FOR PRODUCING SEMICONDUCTOR COMPONENTS, AND SEMICONDUCTOR COMPONENT

(71) Applicant: MI2-FACTORY GMBH, Jena (DE)

(72) Inventors: Constantin Csato, Stammbach (DE); Florian Krippendorf, Jena (DE)

(73) Assignee: MI2-FACTORY GMBH, Jena (DE)

( * ) Notice: Subject to any disclaimer, the term of this patent is extended or adjusted under 35 U.S.C. 154(b) by 560 days.

(21) Appl. No.: 17/611,474

(22) PCT Filed: May 14, 2020

(86) PCT No.: PCT/EP2020/063556
§ 371 (c)(1),
(2) Date: Nov. 15, 2021

(87) PCT Pub. No.: WO2020/229639
PCT Pub. Date: Nov. 19, 2020

(65) Prior Publication Data
US 2022/0246431 A1 Aug. 4, 2022

(30) Foreign Application Priority Data
May 16, 2019 (DE) .................... 10 2019 112 985.0

(51) Int. Cl.
*H01L 21/04* (2006.01)
*H10D 30/66* (2025.01)
(Continued)

(52) U.S. Cl.
CPC ......... *H01L 21/0465* (2013.01); *H10D 30/66* (2025.01); *H10D 62/393* (2025.01); *H10D 62/8325* (2025.01)

(58) Field of Classification Search
CPC ........... H01L 29/7802; H01L 29/66712; H01L 29/1608; H01L 29/36; H01L 29/0878;
(Continued)

(56) References Cited

U.S. PATENT DOCUMENTS 5,731,637 A * 3/1998 Hori .................. H01L 21/26506
438/479
10,141,219 B2 * 11/2018 Drescher ................ B28D 1/221
(Continued)

FOREIGN PATENT DOCUMENTS

DE        10239312 A1    3/2004
DE    102013016669 A1    4/2015
(Continued)

OTHER PUBLICATIONS

Rupp (Materials Science Forum, ISSN 1662-9732, vol. 838, pp. 531-534) (Year: 2016).*
(Continued)

*Primary Examiner* — Chad M Dicke
*Assistant Examiner* — Jeremy Daniel Watts
(74) *Attorney, Agent, or Firm* — LUCAS & MERCANTI, LLP

(57) ABSTRACT

A method for the production of semiconductor components with a vertical structure includes the step of providing a substrate of semiconductor material with a thickness of 4 μm to 300 μm. Then a doped drift zone of the semiconductor component is produced by ion implantation in the substrate using an energy filter, wherein the energy filter is a microstructured membrane with a predefined structural profile for setting a dopant depth profile and/or a defect depth profile produced in the substrate by the implantation. When the drift zone is being produced, the entire drift zone is doped, and the drift zone is produced completely without any epitactic deposition.

21 Claims, 16 Drawing Sheets

(51) Int. Cl.
*H10D 62/17* (2025.01)
*H10D 62/832* (2025.01)

(58) Field of Classification Search
CPC ..... H01L 29/1095; H01L 21/0455–046; H01L 21/265–266
See application file for complete search history.

(56) References Cited

U.S. PATENT DOCUMENTS

| | | | |
|---|---|---|---|
| 2007/0108558 | A1 | 5/2007 | Nemoto |
| 2014/0217407 | A1* | 8/2014 | Mizushima ............ H01L 21/263 438/16 |
| 2016/0247713 | A1* | 8/2016 | Drescher ................ B23K 26/53 |
| 2017/0352519 | A1* | 12/2017 | Rupp ....................... H01J 37/05 |
| 2018/0040691 | A1* | 2/2018 | Breymesser ........... H10D 8/411 |
| 2019/0006471 | A1* | 1/2019 | Watanabe ............... H10D 30/66 |
| 2019/0051488 | A1 | 2/2019 | Schustereder |
| 2019/0097042 | A1* | 3/2019 | Meiser ................ H10D 64/513 |
| 2019/0267209 | A1* | 8/2019 | Krippendorf ....... H01J 37/1477 |
| 2020/0135847 | A1* | 4/2020 | Kiyoi ................ H01L 21/26506 |
| 2020/0303506 | A1* | 9/2020 | Kiyosawa ............ C23C 16/4584 |
| 2020/0381253 | A1* | 12/2020 | Schulze ............... H10D 62/111 |

FOREIGN PATENT DOCUMENTS

| | | |
|---|---|---|
| JP | 2015192121 A | 11/2015 |
| JP | 2018014486 A | 1/2018 |
| JP | 2019046793 A | 3/2019 |

OTHER PUBLICATIONS

International Search Report Dated Oct. 20, 2020, 3 Pages.
Roland Rupp et al: "Alternative Highly Homogenous Drift Layer Doping for 650 V SiC Devices", Materials Science Forum, vol. 858, 24. Mai 2016 (May 24, 2016), Seiten 531-534, XP055718647, DOI: 10.4028/www.scientific.net/MSF.858.531.
Lutz et al, Semiconductor Power Device, 2011; 3 Pages.

* cited by examiner

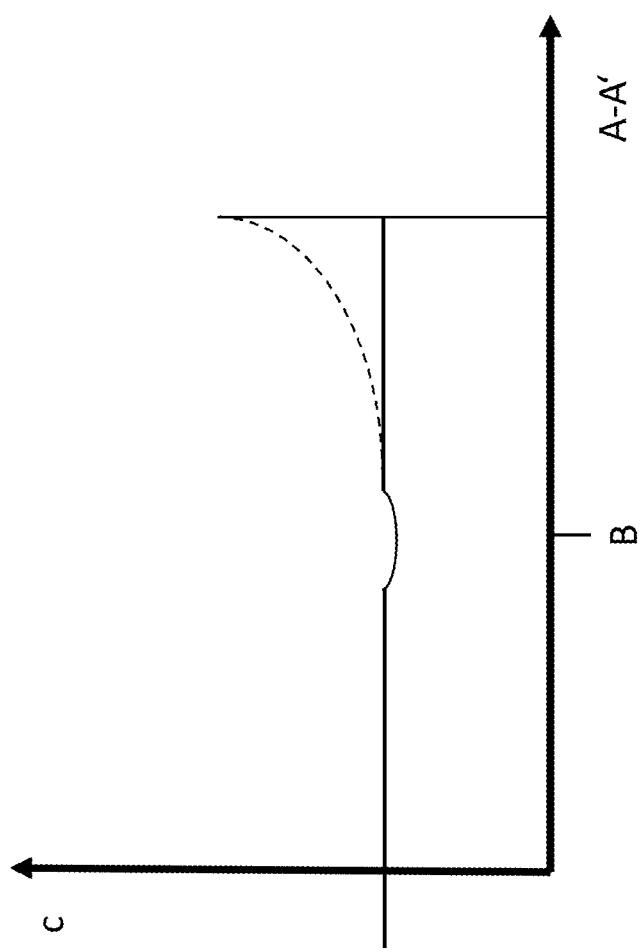

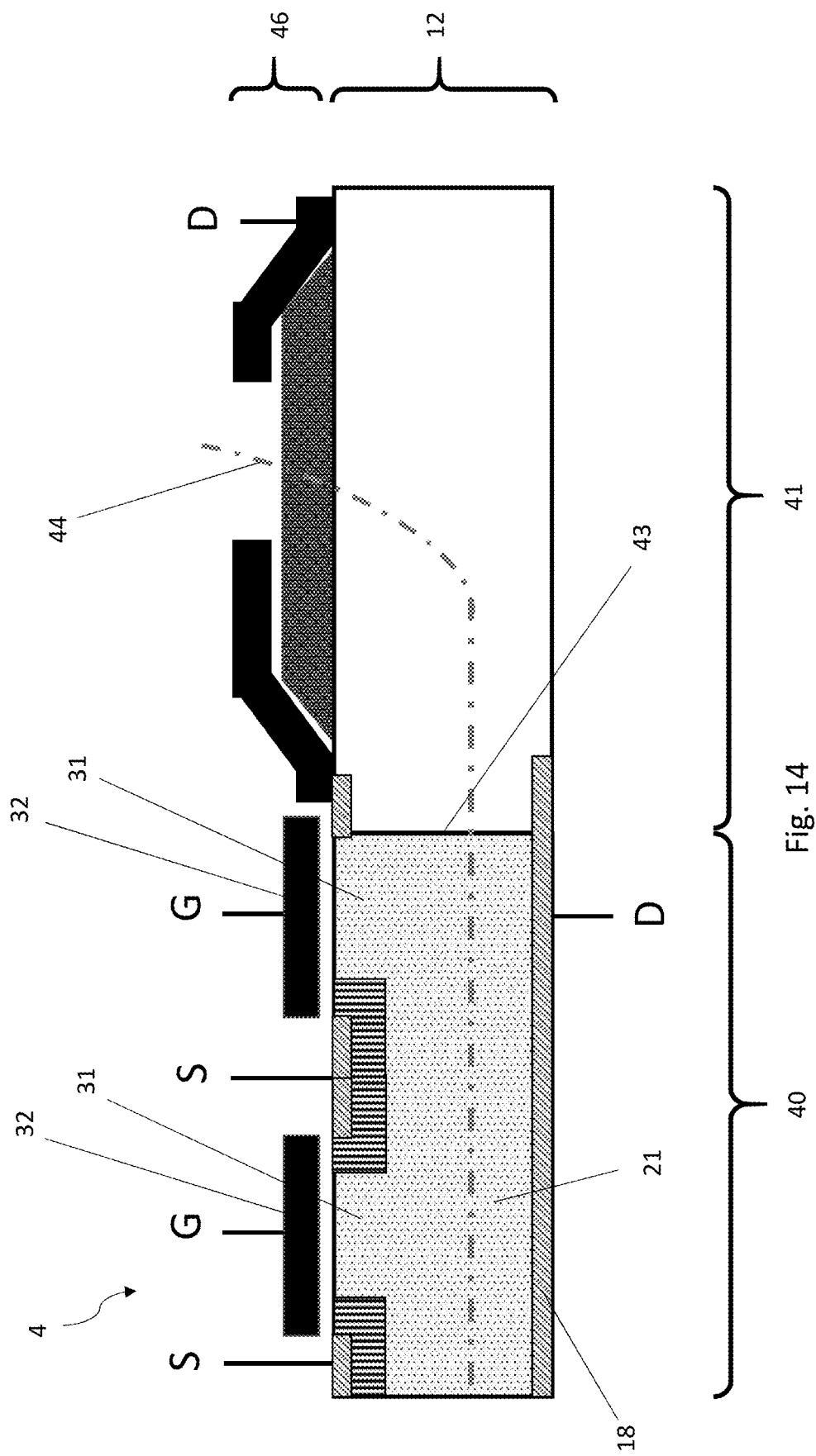

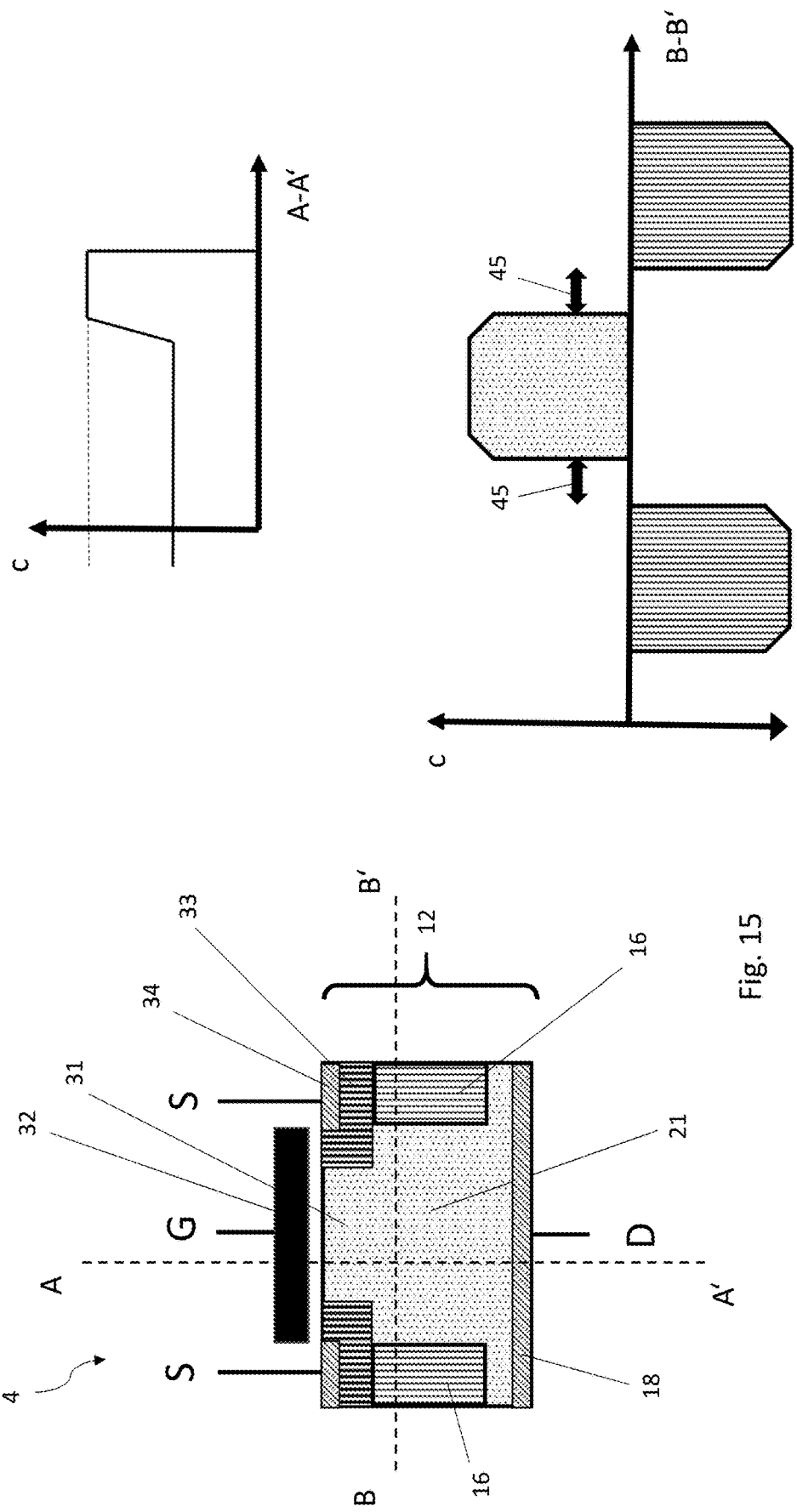

METHOD FOR PRODUCING SEMICONDUCTOR COMPONENTS, AND SEMICONDUCTOR COMPONENT

CROSS-REFERENCE TO RELATED APPLICATIONS

The present application is a 371 of International application PCT/EP2020/063556, filed May 14, 2020, which claims priority of DE 10 2019 112 985.0, filed May 16, 2019, the priority of these applications is hereby claimed, and these applications are incorporated herein by reference.

BACKGROUND OF THE INVENTION

The invention relates to a method for the production of semiconductor components and to a semiconductor component.

Discrete high-blocking power semiconductor components with a nominal blocking voltage of more than 600 V are generally built up vertically both in silicon and in SiC. For diodes, e.g., MPS (merged-pin-Schottky) diodes, Schottky diodes, or p-n diodes, this means that the cathode is arranged on the front of the substrate and the anode on the rear. A similar arrangement is used in the case of vertical power MOS (metal oxide semiconductor) components. Gate and source electrodes are located on the front of the substrate, while the drain electrode is on the rear. In the case of conventional power MOSFETs, the transistor element itself or channel area can be arranged parallel to the surface (D-MOS) or perpendicular to the surface (Trench MOS). Special layouts have become established for SiC-MOSFETs, e.g., trench transistors.

The width of the drift zone (=active zone, voltage-absorbing layer) is set as a function of the required blocking capacity (reverse blocking voltage). For example, the width of the drift zone for a 600 V MOSFET component in silicon will be about 50 µm.

In the case of so-called superjunction components, the width of the voltage-absorbing layer can be somewhat reduced in comparison to "simple" vertical MOSFETs. The special feature of this type of vertical component is that the drift zone is characterized by an alternating arrangement of vertical p-doped and n-doped pillars. When blocking occurs, the additionally introduced p-doping compensates for the increased charge in the n-doped area, which, in the power-on state, determines the resistance between the source electrode and the drain electrode. Thus, for the same blocking capacity, the power-on resistance can be reduced by up to a factor of 10 in comparison to that of conventional vertical MOS transistors. The actual transistor element or channel area can, in the case of superjunction MOSFET architectures, be parallel to the surface (D-MOS) or perpendicular to the surface (trench-MOS).

For vertical power semiconductor components, the special material properties of SiC require that specific production methods be provided and that special architectures be used for the channel and transistor areas.

According to the prior art, the active zones of many vertical power diodes and all power transistors (MOSFET) are formed in epitactic, i.e., monocrystalline, layers. These epitactic layers are deposited on crystalline carrier wafers. Thus the doping in the active zone can be coordinated with the blocking voltage in question, and the highly doped carrier wafer can be optimized with respect to its doping in such a way that its contribution to the power-on resistance is minimized.

Especially in the case of SiC substrates, the above-described production of the layer structure is complicated and expensive, because, first, the carrier wafers, which have no active function in the component, are very expensive; and, second, epitactic layer deposition is enormously cost-intensive.

SUMMARY OF THE INVENTION

It is an object of the present invention to provide a method for the production of semiconductor components by means of which high-power semiconductor components of high quality can be produced industrially with reduced effort and at lower cost.

According to an aspect of the invention, the method for the production of semiconductor components with a vertical structure comprises the steps of:
providing a substrate of semiconductor material with a thickness of 4 µm to 300 µm;
producing a doped drift zone of the semiconductor component by means of ion implantation in the substrate using an energy filter, wherein the energy filter is a microstructured membrane with a predefined structural profile for setting a dopant depth profile and/or a defect depth profile produced in the substrate by the implantation, wherein the entire drift zone is doped during the production of the drift zone. The production of the drift zone is carried out in its entirety without any epitactic deposition.

When, in the production of a semiconductor component, the drift zone is obtained by the use of the above steps, the cost of production is significantly reduced.

It is especially preferred that the semiconductor material of the substrate in the method described above be SiC. In this case, the substrate has a thickness of 4 µm to 30 µm. Here the savings versus conventional production methods are especially pronounced.

It is preferred that the semiconductor material of the substrate be undoped or weakly n-doped prior to the production of the drift zone.

The thickness of the substrate is preferably between 4 and 25 µm, more preferably between 4 and 20 µm, more preferably between 4 and 15 mum, more preferably between 6 and 14 µm, more preferably between 7 and 13 µm. In these ranges for the thickness of the substrate, it is possible to achieve the complete doping of the drift zone in SiC by ion implantation by means of the accelerators available today in the industry.

The drift zone preferably extends over 40 to 100%, more preferably over 50 to 98%, more preferably over 60 to 95%, of the height of the substrate. As a rule, the percentage tends to be in a higher range of the spectrum indicated.

In a preferred embodiment, the drift zone is n-doped after the ion implantation.

It is preferred that the production of the doped drift zone by ion implantation be achieved from one side of the substrate. Alternatively, especially in the case of thicknesses of SiC substrates of more than 10 µm, the doped drift zone can be achieved by ion implantation from two sides of the substrate. The two implantations from the two sides will then supplement each other to produce the final dopant profile.

It is especially preferable for the production of the doped drift zone to be carried out with ions selected from nitrogen, phosphorus, and hydrogen (the last-mentioned only for silicon crystals) as dopant. In addition to the doping of the drift zone by ion implantation, it is preferred that a doped field-stop layer be produced at one edge of the substrate by means of ion implantation using an energy filter. This simplifies the production process even more and reduces the overall cost.

It is usually desirable for the field-stop layer to be n-doped after the ion implantation, wherein the doping of the field-stop layer is stronger than the doping of the drift zone, preferably at least two times stronger than the doping of the drift zone.

The thickness of the field-stop layer is preferably between 0.6 μm and 150 μm, more preferably between 0.8 μm and 5 μm.

In a preferred embodiment, the ion implantation to produce the field-stop layer is carried out from the side of the substrate on which the field-stop layer is to be formed. This simplifies the production process, and ion beams of lower energy can be used.

It is also preferred that, in addition to the doping of the drift zone by means of ion implantation, a superficial functional zone with areas of different dopings be produced as well by use of ion implantation with an energy filter. As a result, the production of the semiconductor component is simplified even more.

The superficial functional zone is preferably situated at an edge of the substrate which is opposite the field-stop layer. In this way, semiconductor components with a vertical structure are formed. The implantation of the superficial functional zone is preferably carried out from the side of the substrate on which the superficial functional zone is to be formed. This further simplifies the method, and work can be carried out with an ion beam of lower energy.

The thickness of the superficial functional zone is preferably between 0.5 μm and 6 μm, more preferably between 0.8 μm and 5 μm.

To form superjunction components, it is preferred that p-doped pillars also be produced in the area of the drift zone by means of ion implantation using an energy filter. The p-doped pillars serve to compensate for the charge of the n-doped areas of the drift zone.

For the formation of the superficial functional zone and/or of the p-doped pillars, predefined areas of the substrate are preferably masked.

The step of providing the substrate is preferably carried out by splitting a rod-shaped starting crystal of the semiconductor material into thin plates. Each of these thin plates then forms the thin substrate, which is subjected to further treatment by ion implantation.

According to another aspect of the invention, a semiconductor component comprises a substrate of semiconductor material with a thickness of 4 μm to 300 μm, preferably of 4 μm to 30 μm, wherein a dopant profile of the substrate comprises a depression or an elevation in a middle area of the substrate.

BRIEF DESCRIPTION OF THE DRAWINGS

FIG. 8b shows an aggregate dopant profile of the substrate for an implantation from two opposite sides, similar to FIG. 8a;

FIG. 14 shows a schematic cross section through a second embodiment of a semiconductor component according to the invention; and FIG. 15 shows a schematic cross section through a third embodiment of a semiconductor element according to the invention, as well as two associated dopant profiles in directions perpendicular to each other.

DETAILED DESCRIPTION OF SPECIFIC EMBODIMENTS

The method according to the invention for the production of semiconductor elements preferably begins with the step of providing a substrate 12 of semiconductor material. The material of the substrate 12 is preferably silicon carbide (SiC). Other semiconductor materials such as silicon, gallium arsenide, cadmium telluride, zinc selenide, gallium nitride, etc., can also be considered. The substrates 12 are preferably configured as wafers. The substrate 12 is undoped or extremely weakly n-doped at the beginning, e.g., with a dopant concentration of $<5 \times 10^{13}$ cm$^{-3}$.

The substrates 12 have a thickness of 4 μm to 300 μm. As a rule, however, the substrates 12 in the method according to the invention are quite thin. In most cases, the substrates 12 have a thickness of between 4 and 30 μm, preferably of between 4 and 25 μm, more preferably of between 4 and 20 μm, more preferably of between 4 and 15 μm, more preferably of between 6 and 14 μm, and more preferably of between 7 and 13 μm.

Figure 1:
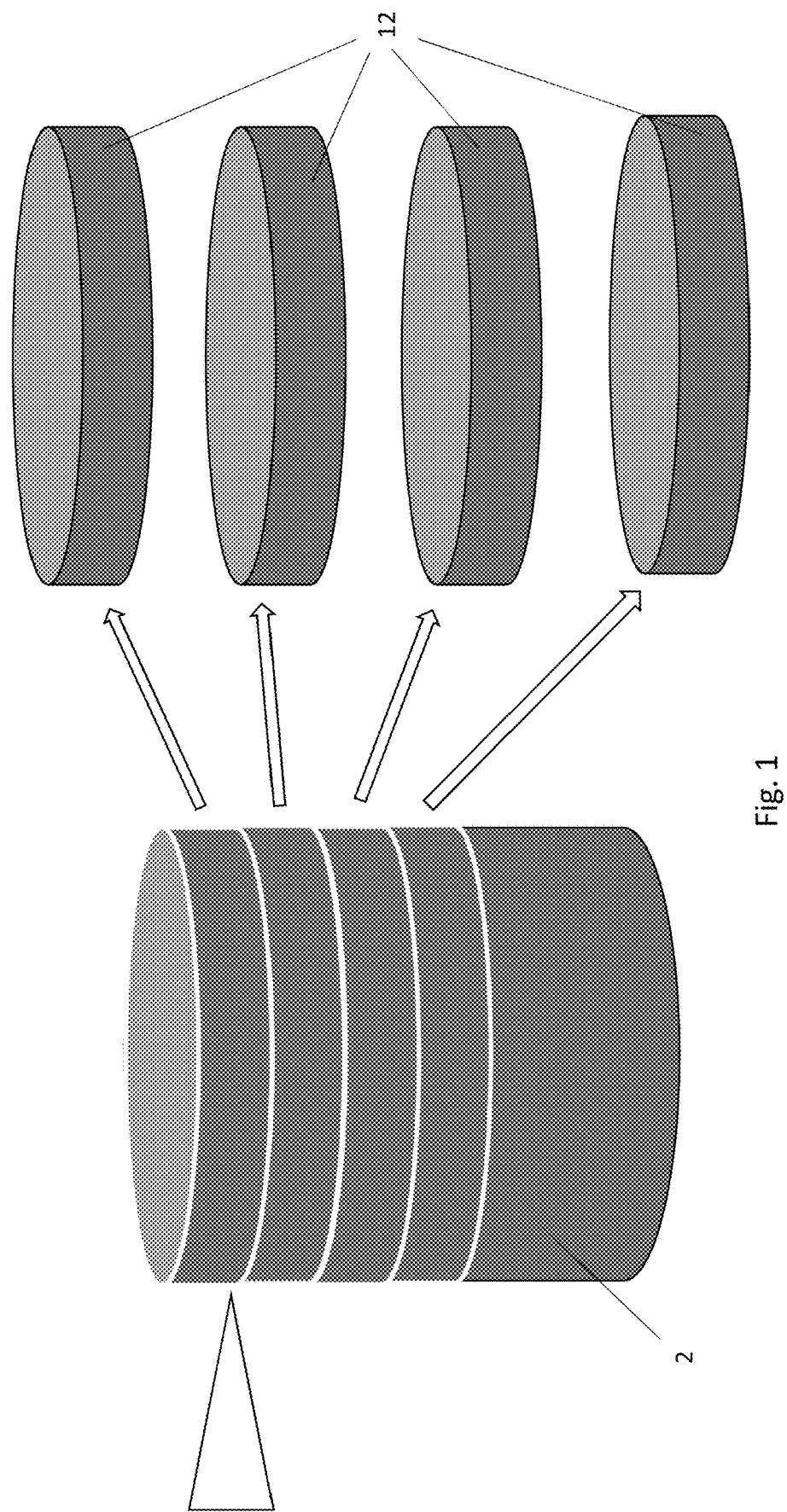
FIG. 1 is a schematic diagram of the splitting of a starting crystal into thin substrate plates, which can be used in the present invention.

An example of obtaining such substrates 12 is illustrated in FIG. 1. An undoped or weakly n-doped starting crystal 2 (e.g., a wafer rod) is split into thin plates, as a result of which the substrates 12 (thin wafers) are formed. The split-off substrates 12 can, if necessary, be temporarily supported mechanically, i.e., reversibly, during the production process by carrier wafers or similar structures to avoid the fracturing of the substrate 12. Another alternative is thin sectioning.

The thickness of the individual substrates 12 preferably corresponds to a previously determined width of a combination of an active drift zone plus a field-stop layer and a superficial functional zone, as will be described further below. The overall thickness of the substrate 12 is thus determined only by the type of semiconductor to be produced, above all by its voltage class. The higher the voltage class, the thicker the substrate 12. The upper limit of 300 µm arises from the range which can be reasonably used in ion implantation (proton beam in silicon). In SiC, the maximum thickness with accelerators currently available in industry is 30 µm. This is also therefore a reasonable upper limit, because a radioactive activation of the base material resulting from extremely high ion beam energy should be avoided.

Figure 2:
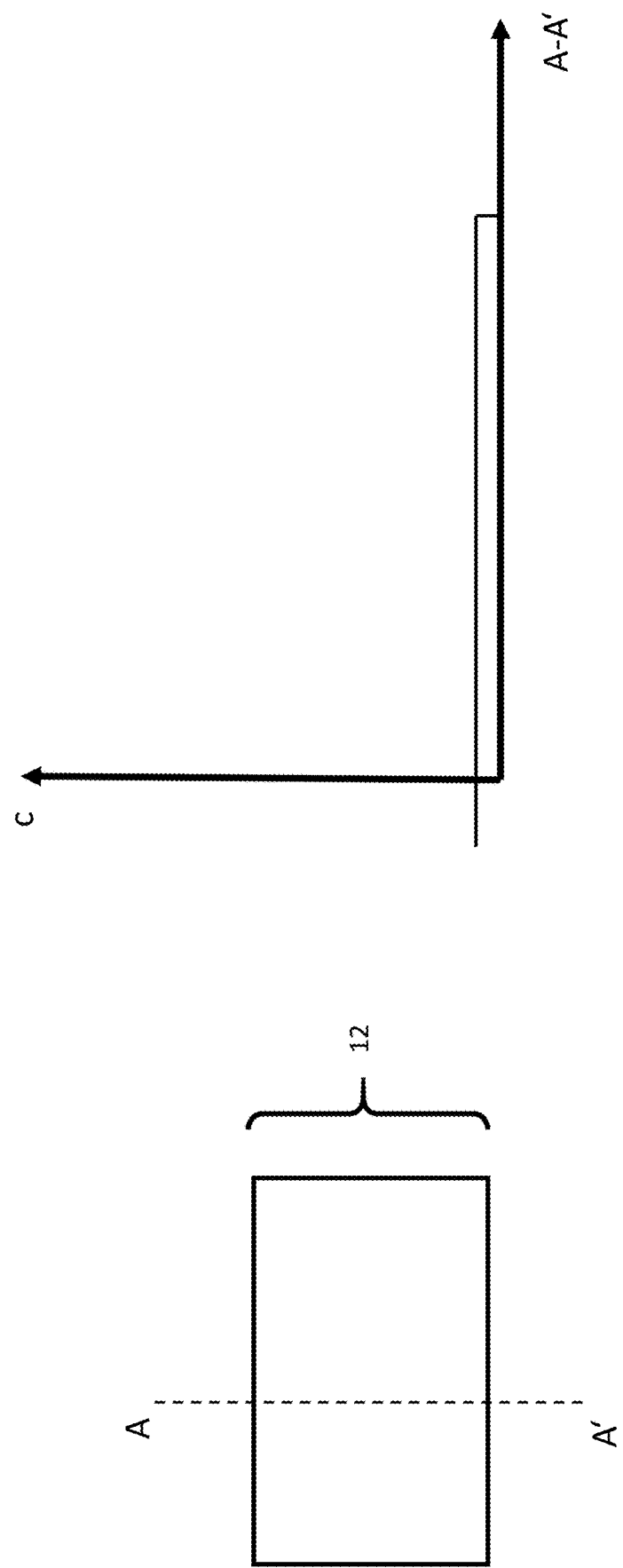
FIG. 2 shows a dopant profile of a substrate prior to the ion implantation of the drift zone.

A dopant profile of a weakly n-doped substrate 12 is shown in FIG. 2. The dopant profile is shown along the section A-A'. c stands for the dopant concentration.

Figure 3:
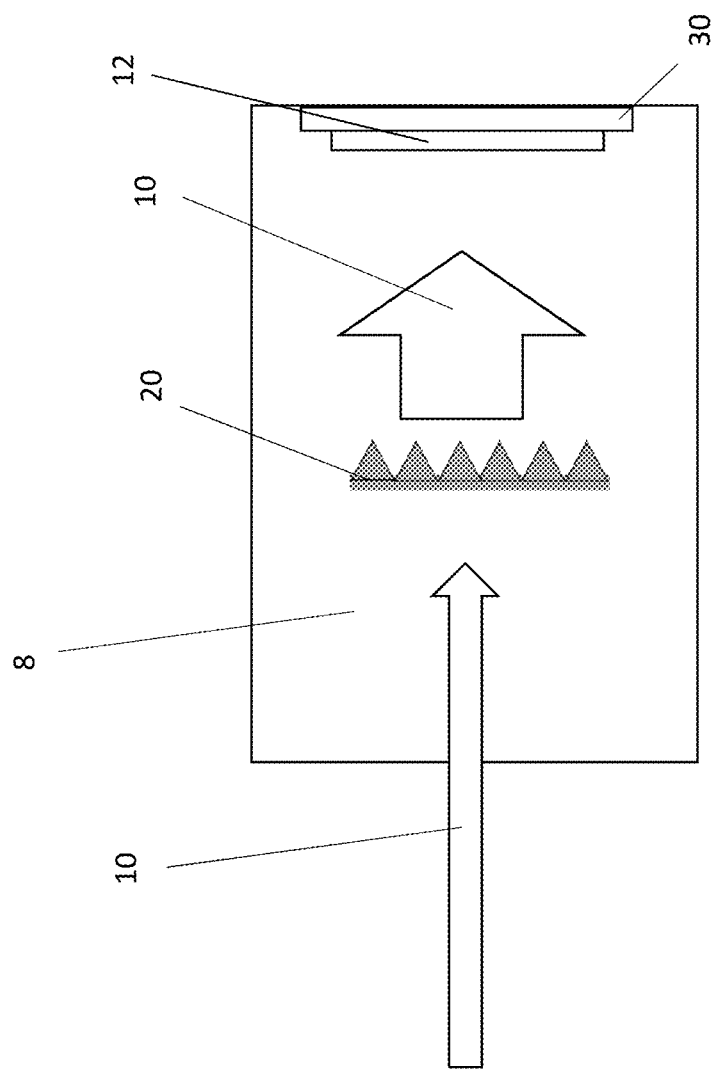
FIG. 3 is a schematic view of the principle effects of ion implantation in a substrate using an energy filter.

After the substrate 12 has been provided, a doped drift zone (also called the active zone or voltage-absorbing zone) is produced in the substrate by means of ion implantation. The corresponding basic layout is shown in FIG. 3. The layout shown in FIG. 3 for ion implantation in a substrate 12 shows an irradiation chamber 8, in which a high vacuum is usually present. In the irradiation chamber 8, the substrate 12 to be doped is mounted in a substrate holder 30.

An ion beam 10 is generated by a particle accelerator (not shown) and conducted into the irradiation chamber 8. There the energy of the ion beam 10 is spread out by an energy filter 20, and it strikes the substrate 12 to be irradiated. Alternatively, the energy filter 20 can be arranged in a separate vacuum chamber, which can be sealed off by valves, and which is placed inside the irradiation chamber 8 or positioned directly adjacent to the irradiation chamber 8.

The substrate holder 30 does not have to be stationary, The substrate holder 30 can instead, as an option, be provided with a device for shifting the substrate 12 in the x-y direction (in the plane perpendicular to the plane of the page). A wafer wheel, on which the substrates 12 to be implanted are mounted and which rotates during the implantation process, can also be considered as a substrate holder 30. A linear displacement of the substrate holder 30 in the beam direction (z direction) is also possible. The substrate holder 30 can also, as an option, be provided with a heater or a cooler.

Figure 4:
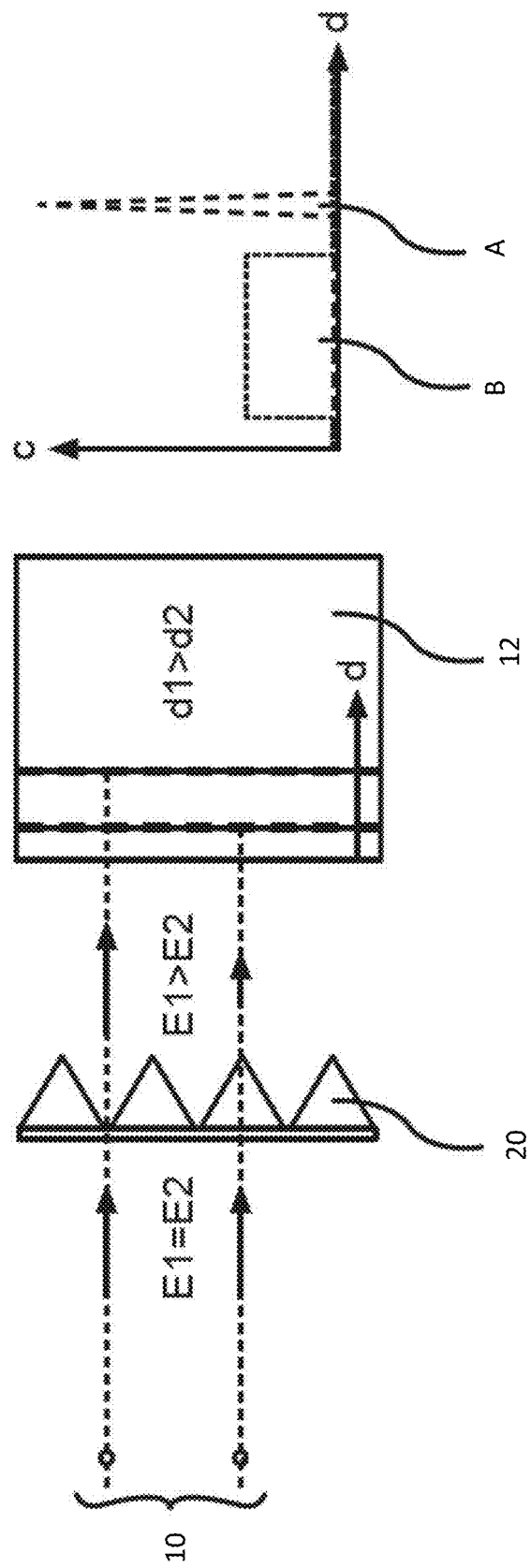
FIG. 4 is a schematic diagram of the way in which an energy filter, which can be used in the method according to the invention, works.

The basic principle of the energy filter 20 is shown in FIG. 4. As the beam passes through the energy filter 20, which is configured as a microstructured membrane, the energy of the monoenergetic ion beam 10 is modified as a function of the point where it enters the energy filter. The resulting energy distribution of the ions of the ion beam 10 leads to a modification of the depth profile of the implanted substance in the matrix of the substrate 12. E1 designates the energy of a first ion, E2 designates the energy of a second ion, c designates the dopant concentration, and d designates the depth in the substrate 12. On the right of the diagram, the conventional Gaussian distribution is identified by the reference symbol A, which is what would be obtained without the use of an energy filter 20. In contrast, a rectangular distribution, which can be obtained with the use of an energy filter 20, is indicated by the reference symbol B by way of example.

Figure 5:
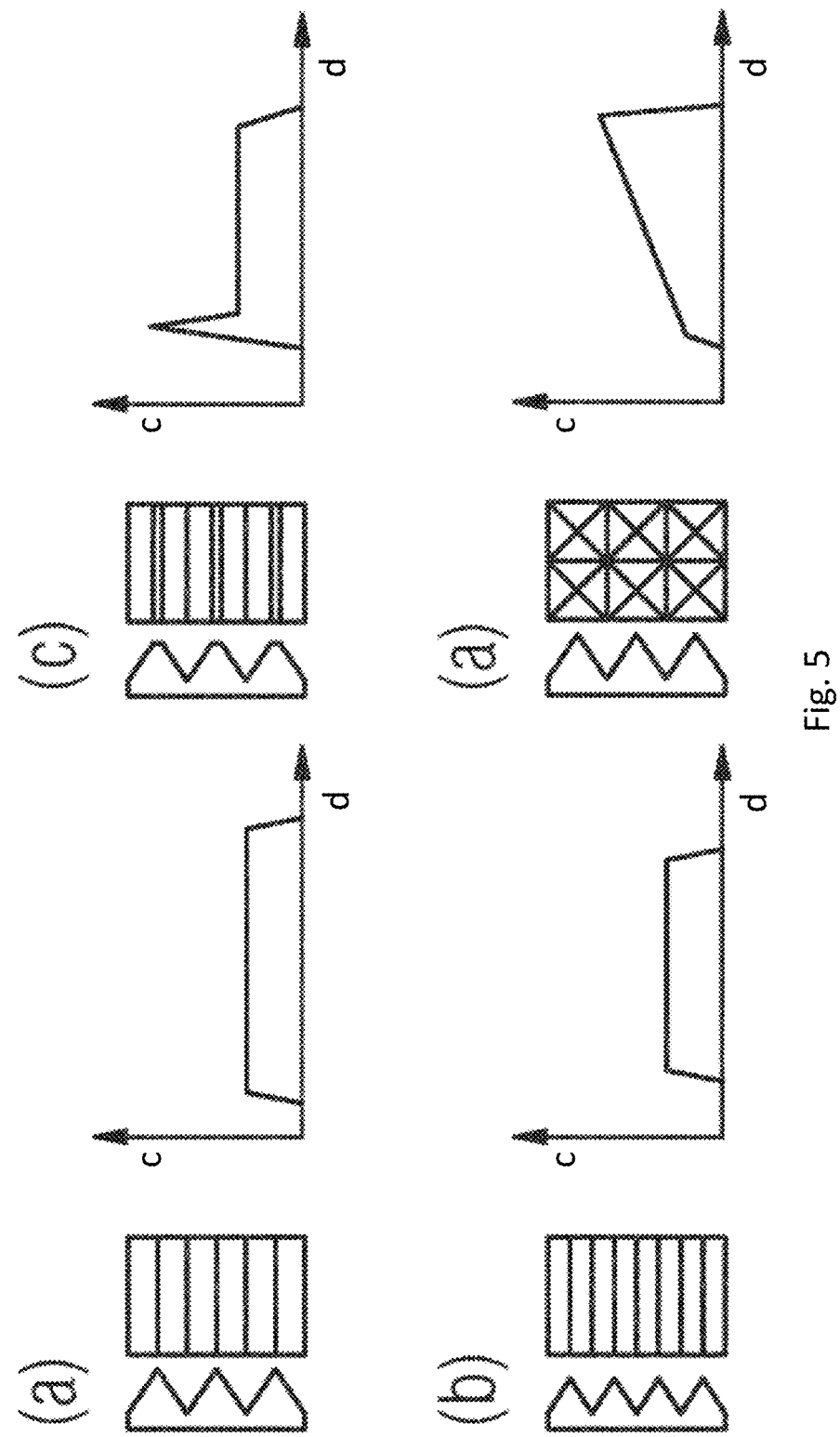
FIG. 5 is a schematic diagram of various dopant profiles, which can be produced by means of energy filters with different structures.

The layout or 3-dimensional structures of the energy filters 20 shown in FIG. 5 illustrate the basic possibilities of generating a plurality of dopant depth profiles or defect depth profiles by means of energy filters 20. c designates again the dopant concentration, and d designates again the depth in the substrate 12. The filter structure profiles can, in principle, be combined with each other to obtain new filter structure profiles and thus new dopant depth profiles or defect depth profiles.

Energy filters 20 of this type are usually made of silicon. They have a thickness of between 3 µm and 200 µm, preferably of between 5 µm and 50 µm, and especially preferably of between 7 µm and 20 µm. The can be mounted in a filter frame (not shown). The filter frame can be mounted in a filter holder (not shown) to allow easy replacement.

For the preferred formation of an n-doped drift zone 21, implantation with ions of nitrogen, phosphorus, or hydrogen (the last-mentioned only for silicon crystals) is especially appropriate.

Figure 6:
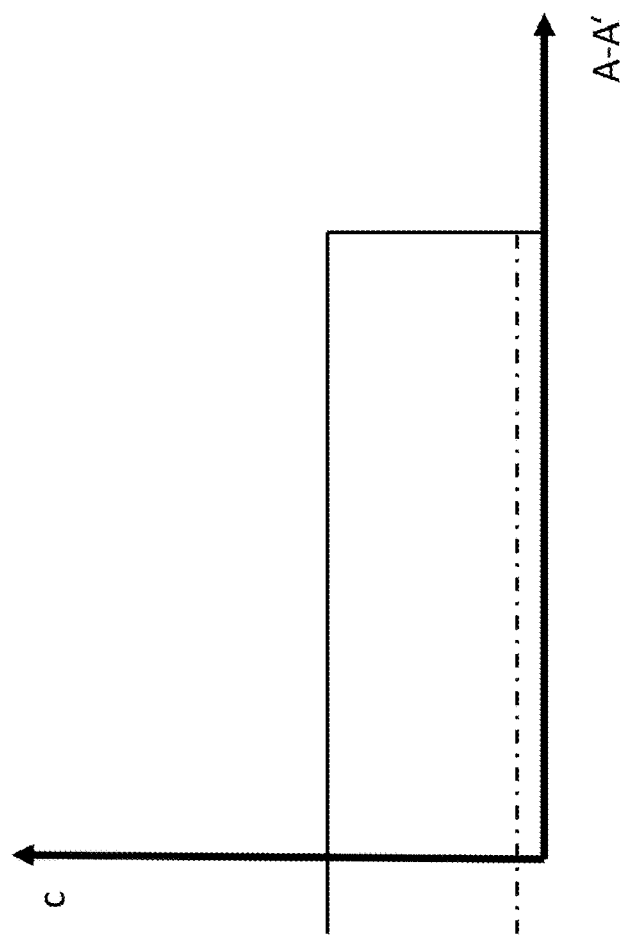
FIG. 6 shows schematically the course of the doping of the drift zone and a resulting dopant profile of the substrate obtained as a result.
Figure 6:
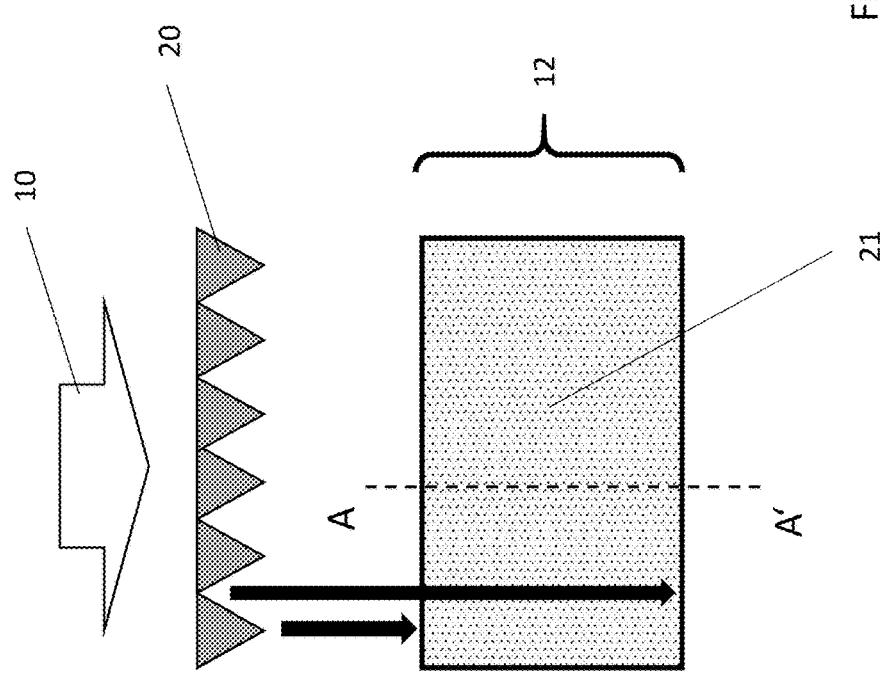

In the case of the exemplary embodiment of the method step of doping the drift zone 21 as shown in FIG. 6, the ion implantation in the substrate 12 is carried out from only one side. In the present case, it is carried out from the front of the substrate 12. The short, solid black arrow indicates the ions of minimal energy transmitted through the energy filter 20, and the long, solid black arrow indicates the ions of maximum energy transmitted through the energy filter 20. The resulting dopant profile along the section A-A' is shown on the right in the coordinate system, where c stands again for the dopant concentration. The dopant profile is approximately uniform over the entire substrate 12. The ion implantation in the substrate 12 can also be carried out from the rear of the substrate 12. In this exemplary embodiment, the substrate 12, as in all of the other exemplary embodiments, is itself formed as the drift zone 21. There is no epitaxial deposition.

Figure 7:
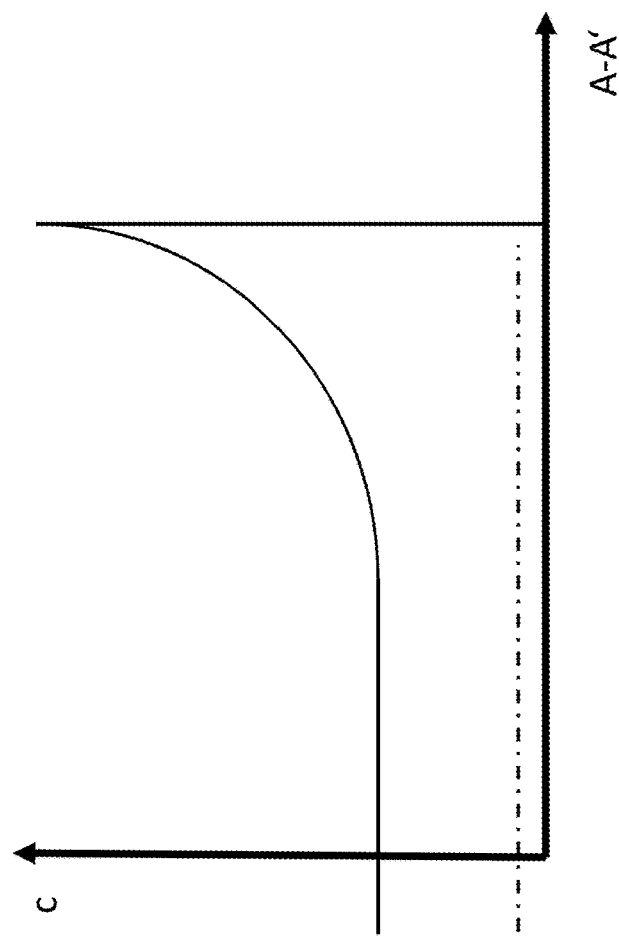
FIG. 7 shows schematically the course of the doping of the drift zone and an alternative dopant profile in the substrate obtained as a result.
Figure 7:
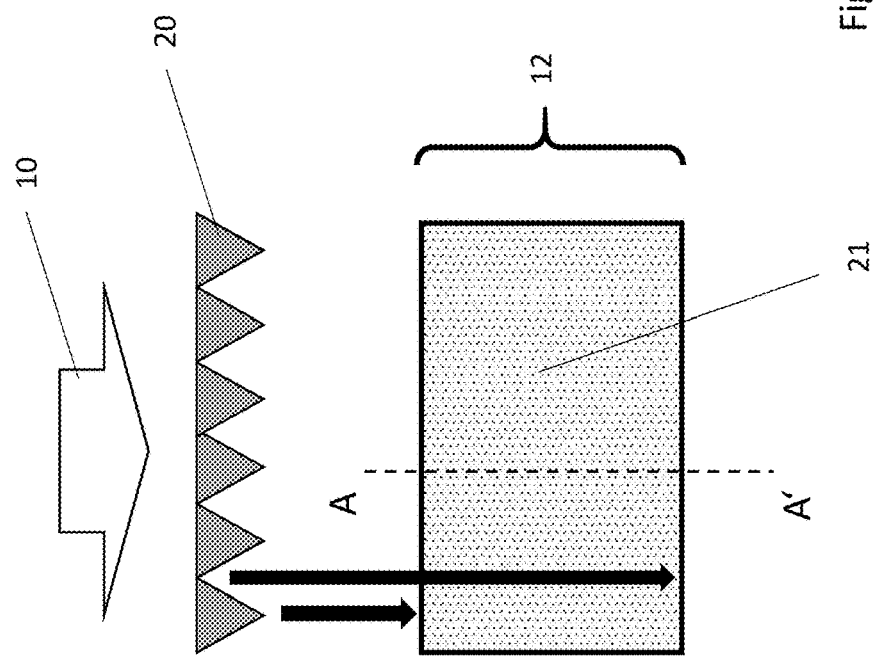

The embodiment of the method step of doping the drift zone 21 as shown in FIG. 7 is similar to the exemplary embodiment according to FIG. 6. The only difference is the form of the dopant profile, which has a shape rising toward the rear surface of the substrate 12.

Figure 8A:
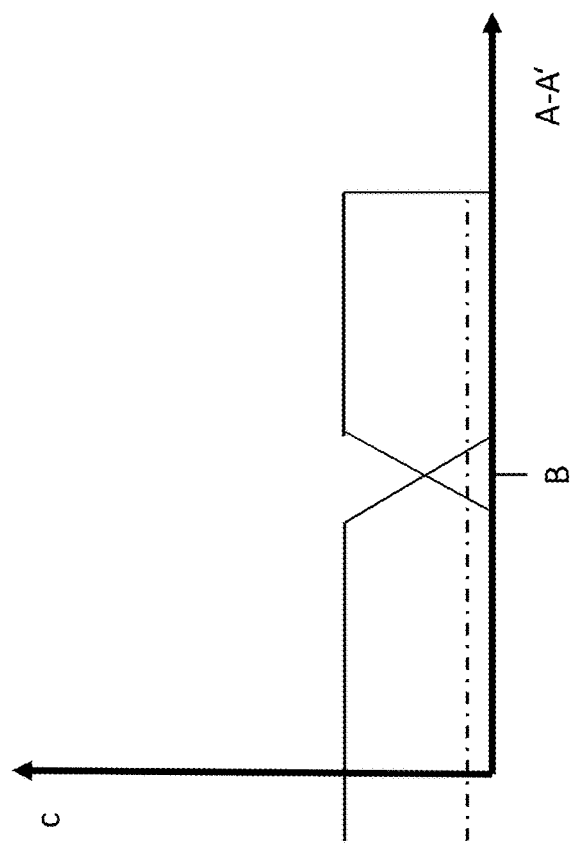
FIG. 8a shows schematically an alternative course of the doping of the drift zone and a resulting alternative dopant profile, wherein the implantation is carried out from two opposite sides of the substrate.
Figure 8A:
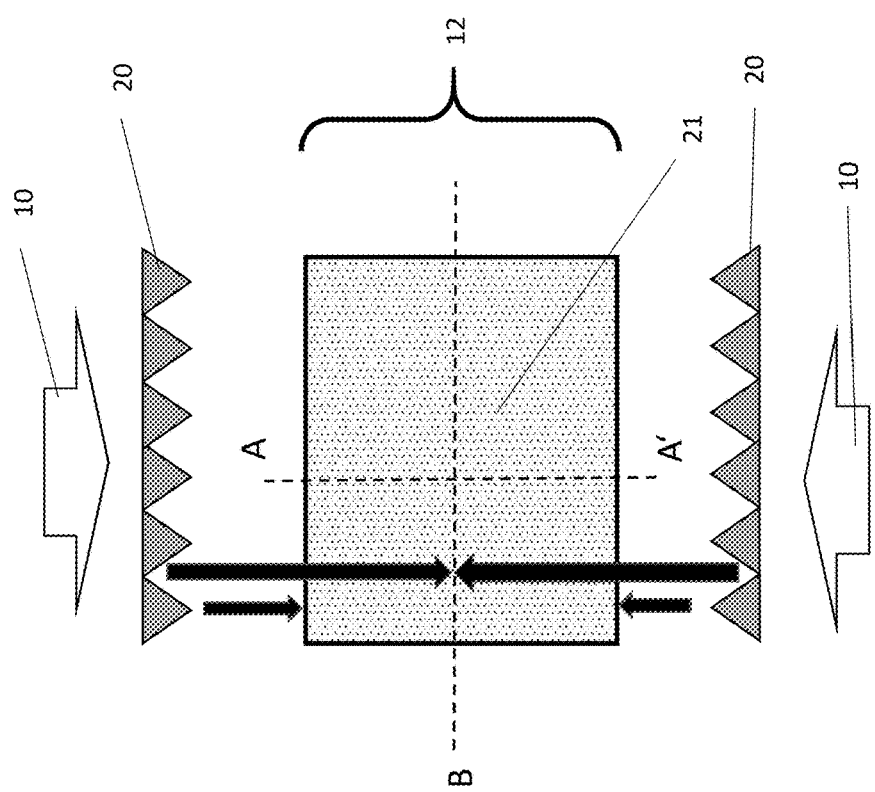

The exemplary embodiment of the method step of doping the drift zone 21 shown in FIG. 8*a* is similar to the exemplary embodiment according to FIG. 6, except that here the substrate 12 is doped from two opposite sides, from the front and rear of the substrate 12. A dopant profile is realized from the front and from the rear of the substrate 12 by means of appropriately configured energy filters 20, wherein each dopant profile is characterized by a concentration plateau P1, P2 and a dopant flank S1, S2. As a result, overlapping dopant profiles are usually formed, and the dopable thickness of the substrate 12 can thus be increased. In addition to the linear rise and fall shown in FIG. 8*a*, S1, S2 can also be formed with any desired curved shape. The plateaus P1 and P2 can also be provided with a rising or falling shape or with any desired curved shape.

For example, the reach of nitrogen implantations in SiC with accelerators available today in industry is quite limited. By means of two combined implantations, one of which is carried out from the front and the other from the rear, it is possible to achieve a doped substrate thickness of up to 20 µm, possibly even up to as much as 30 µm, with available accelerators. This increases the dielectric strength of the semiconductor component to be produced.

The implantation from two sides is usually carried out successively. In this case, the substrate 12 is usually rotated by 180° between the implantations, so that work can be carried out with the same ion beam device. It is also conceivable that the implantations could be performed from two sides with two different ion beam devices. Simultaneous implantation from two sides is thus also conceivable.

FIG. 8b shows by way of example an aggregate dopant profile of the substrate for an implantation similar to that shown in FIG. 8a. The aggregate dopant profile of the drift zone 21 comprises a depression in a middle area of the substrate 12. It would also be possible for it to have an elevation here. The dopant profile of the drift zone 21 is substantially constant from a first edge area of the substrate 12 (on the left) to the middle area. The dopant profile of the drift zone 21 is also substantially constant from a second edge area of the substrate 12 (on the right), opposite the first edge area, to the middle area.

It is also possible for the doping of the substrate 12 to be used not only to produce a drift zone 21 but also to produce other areas of the semiconductor element 4. In that case it can also be effective in the case of implantation from two sides for the dopant profile to fall from a second edge area of the substrate 12, which is opposite the first edge area, toward the middle area, as shown in broken line. As a result, a more highly doped field-stop layer can be formed in the second edge area, for example.

In all of these embodiments, the middle area is usually situated within a range of between 20% and 80%, preferably of between 30% and 70%, more preferably of between 40% and 60%, of the thickness of the substrate 12.

Figure 9:
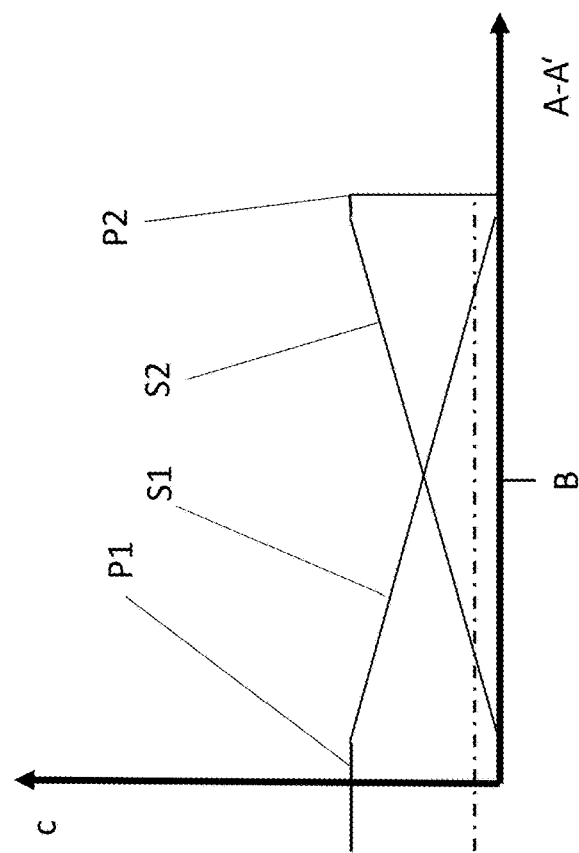
FIG. 9 shows schematically an alternative course of the doping of the drift zone and a resulting alternative dopant profile of the substrate, wherein the implantation is carried out from two opposite sides of the substrate.
Figure 9:
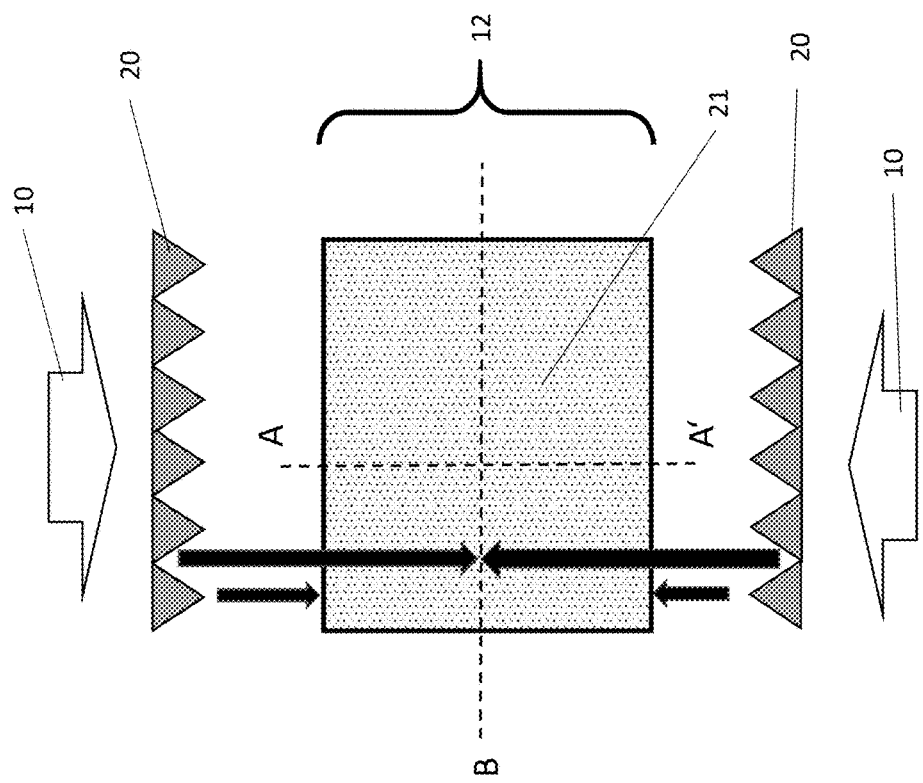

Another advantageous embodiment is shown in FIG. 9. The embodiment corresponds in its essential parts to the embodiment according to FIGS. 8a and 8b. A dopant profile is again realized by means of appropriately configured energy filters 20 with implantation from the front and from the rear of the substrate 12, wherein each dopant profile is characterized by a concentration plateau P1, P2 and a dopant flank S1, S2. The advantage of this embodiment is that variations in the thickness of the substrate 12 result in only slight fluctuations of the resulting aggregate dopant concentration, and thus an elevation or a depression in the middle area of the drift zone 21 is avoided as effectively as possible. The flatter the shape of S1 and S2, the smaller the resulting variations in the dopant concentrations. In addition to the linear rise and fall shown in FIG. 9, S1, S2 can also again be configured with any desired curved shape. The plateaus P1 and P2 can again be configured with a rise or fall or any desired curved shape.

Figure 10:
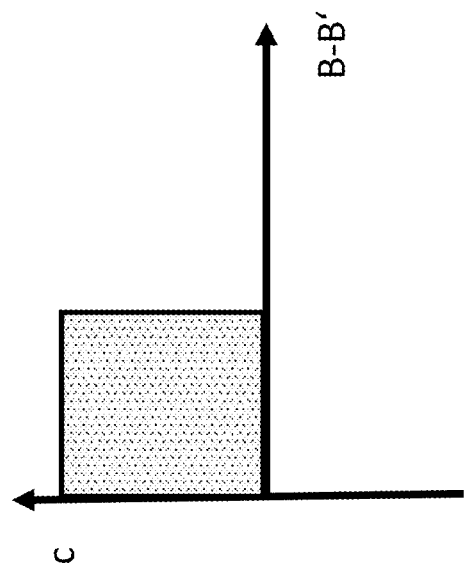
FIG. 10 shows schematically the course of the doping of the drift zone with the use of the masking of predefined areas of the substrate and a resulting alternative dopant profile of the substrate.
Figure 10:
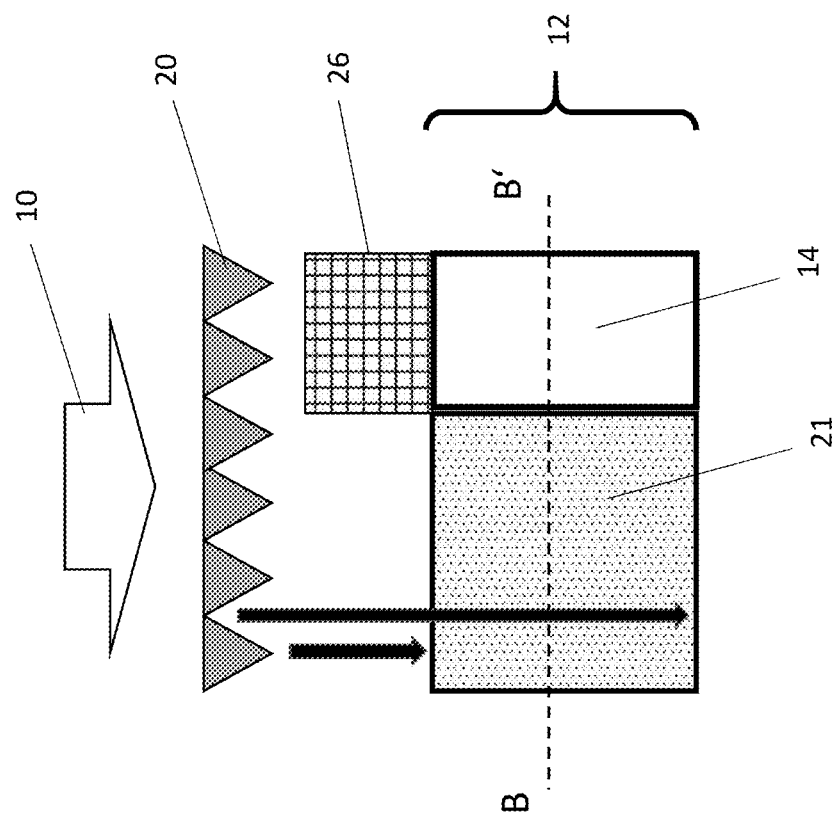

In the case of the production of certain components, as will be described below with reference to FIGS. 14 and 15, the energy-filtered implantation must be carried out with the help of masks, and it may be necessary to conduct a masked, energy-filtered implantation multiple times. As shown in FIG. 10, a mask 26 is arranged on the front of the substrate 12. This achieves the object that the area of the substrate 12 covered by the mask 26 is not doped. The mask 26 does not have to be permanently connected to the substrate 12 but can instead be realized by screen masks (not shown) arranged a predefined distance away from the substrate 12.

As shown in FIG. 10, it is thus possible for undoped regions 14 to remain in the substrate 12 in spite of the doping of the drift zone 21.

Figure 11:
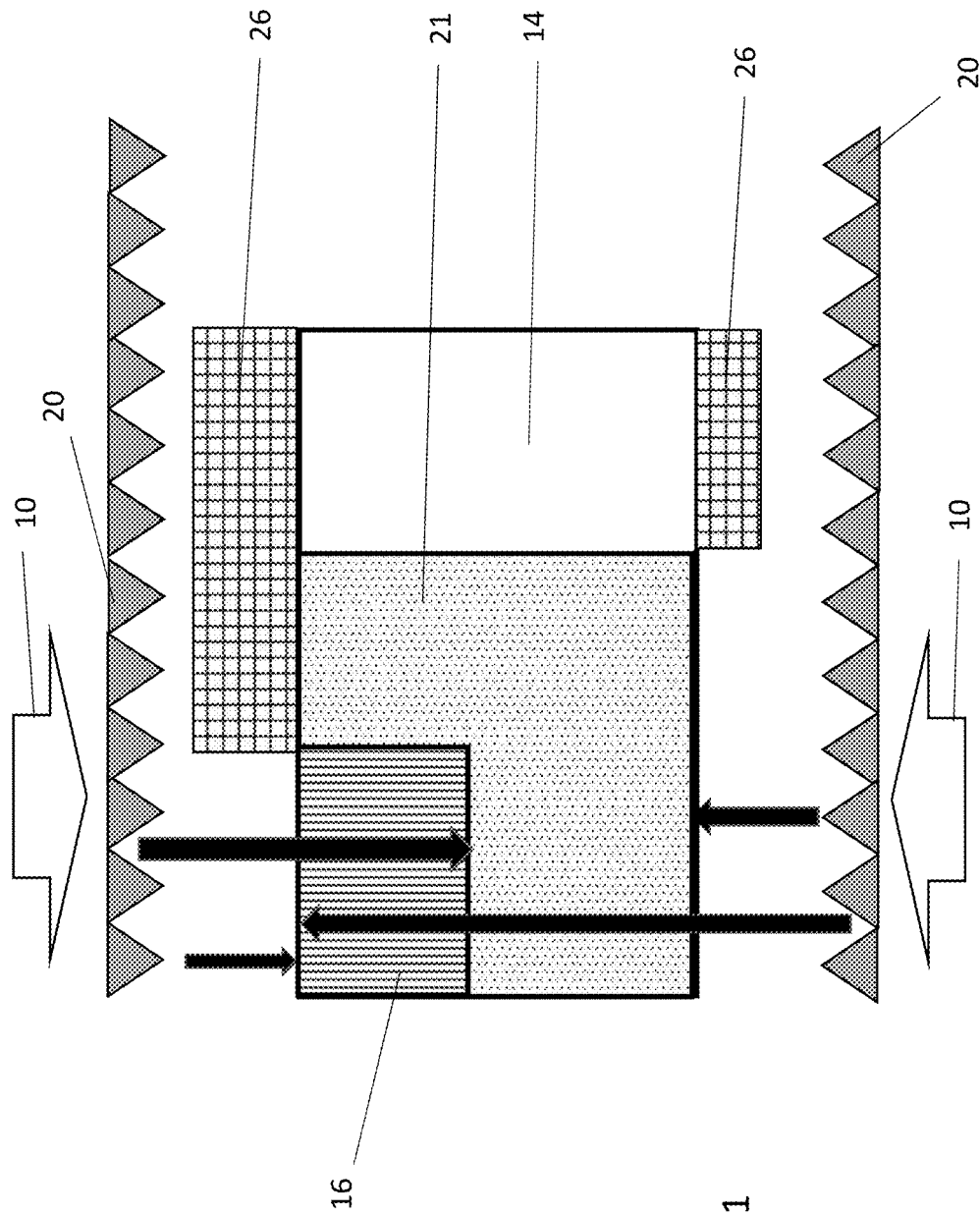
FIG. 11 shows schematically the course of an ion implantation from two opposite sides of the substrate with the use of masked areas.

Masks 26 can also be provided on opposite sides of the substrate 12 and used possibly simultaneously. An example of this can be seen in FIG. 11, where a p-doped pillar 16 is formed in an n-doped drift zone 21, as is necessary for the production of the semiconductor component 4 according to FIG. 15. Here the ion beam shown at the top is an ion beam for p-doping with, for example, aluminum ions, whereas the ion beam 10 at the bottom is an ion beam for n-doping with nitrogen atoms, for example.

Figure 12:
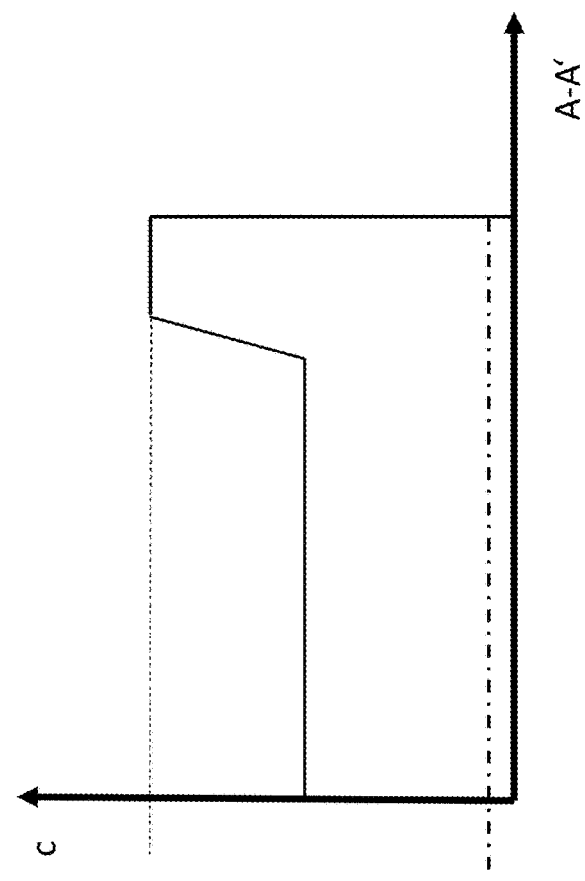
FIG. 12 shows schematically the course of ion implantation to form a field-stop layer and a resulting dopant profile of the substrate.
Figure 12:
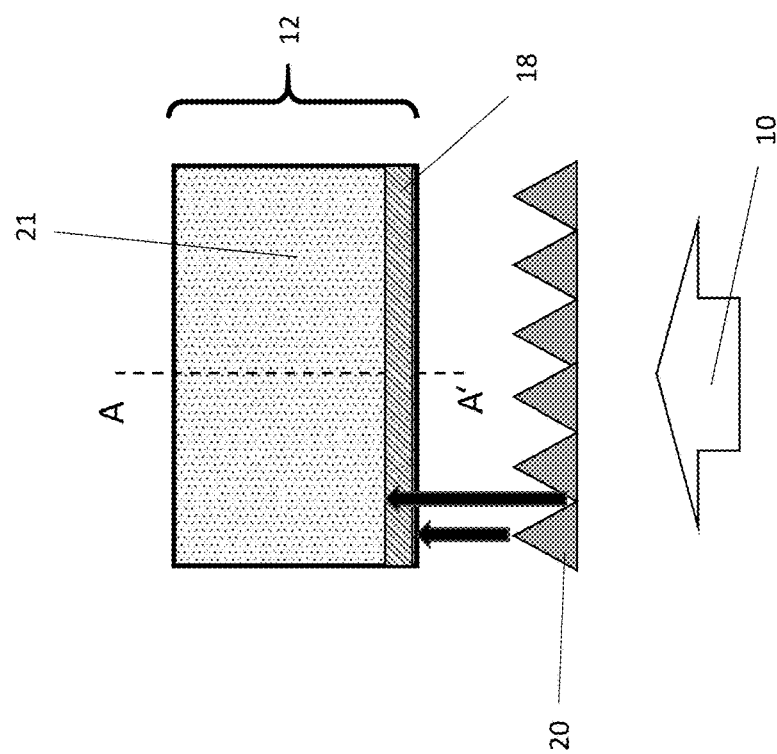

The doping of a field-stop layer 18 shown in FIG. 12 on the rear of the substrate 12 is carried out prior to, simultaneously with, or after the formation of the doping of the drift zone 21. The doping of the field-stop layer 18 is preferably carried out from the rear of the substrate 12, but if the implantation process is appropriately configured, implantation can also be performed from the front.

The field-stop layer 18 is preferably n-doped. Thus especially nitrogen ions or phosphorus ions are suitable for the formation of the field-stop layer 18. The doping of the field-stop layer 18 is stronger than the doping of the drift zone 21. The doping of the field-stop layer 18 is preferably more than twice as strong as the doping of the drift zone 21. The thickness of the field-stop layer 18 is between 0.5 μm and 6 μm, preferably between 0.8 μm and 5 μm. No epitaxial process is required for the formation of the field-stop layer 18.

A superficial functional zone 24 can also be formed on the front of the substrate 12 prior to, simultaneously with, or after the formation of the doping of the drift zone 21 in the substrate 12 and also prior to, simultaneously with, or after the formation of the doping of the field-stop layer 18. This can be achieved by doping different areas of the front of the substrate 12 by ion implantation with the use of an energy filter 20, but other techniques are also conceivable.

When some or all areas of the superficial functional zone 24 are doped by implantation, the doping of these areas of the superficial functional zone 24 is preferably achieved from the front of the substrate 12, but if the implantation process and energy filter 20 are appropriately configured, it an also be carried out from the rear.

The thickness of the superficial functional zone 24 is between 0.5 μm and 6 μm, preferably between 0.8 μm and 5 μm. The superficial functional zone 24 can be configured in a wide variety of ways.

All of the implantations described as forming part of the invention must be healed in an annealing process, so that the doping atoms can be electrically activated.

Finally, channel areas, p-n transitions, terminal metalizations, etc., can be applied to the front. On the rear of the substrate 12, a drain terminal metalization and possibly a n++ terminal region can be arranged.

Figure 13:
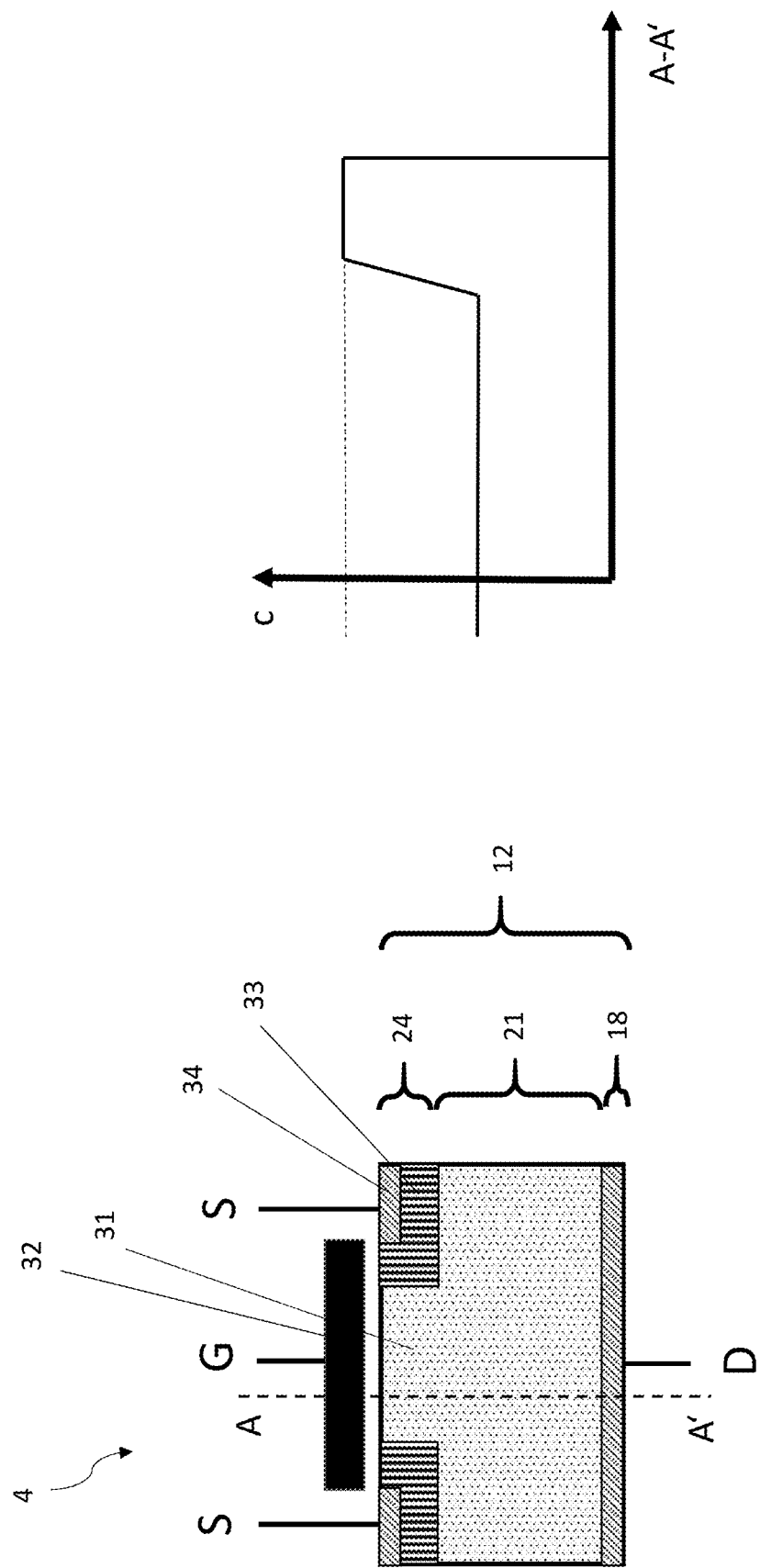
FIG. 13 shows a schematic cross section through a first embodiment of a semiconductor component according to the invention, including the associated dopant profile.

An example of a semiconductor component 4 with a vertical structure according to the invention is shown in FIG. 13.

A vertical semiconductor component structure, especially for diodes (Schottky diodes, MPS diodes, and p-n diodes) and MOSFETs with a superficial functional zone 24 (IGBT, MOS transistor, channel area, p-n transition, Schottky diode), a drift zone 21, and a field-stop layer 18, but without a carrier wafer, can be produced according to the invention.

This structure is characterized in that, with respect to its vertical dimension, it corresponds exactly to the required width of the drift zone 21 plus that of the field-stop layer 18 plus that of the functional superficial zone 24. Especially remarkable is the fact that this structure achieves the minimum conceivable thickness of the chip or of the substrate 12 for the formation of completely vertical high-voltage power components.

In the case of FIG. 13, a MOSFET is shown by way of example. S stands for the source terminal, G for the gate terminal, and D for the drain terminal. The superficial functional zone 24 consists of a MOS channel area 31, a gate electrode 32, a p-body 33, and a source terminal region 34.

Another example of a semiconductor component 4 according to the invention with a vertical structure is shown in FIG. 14. The same reference symbols are used to designate the same elements as those appearing in FIG. 13.

Real high-voltage components consist of an active area 40 and an edge area 41. Because of the sawn edge of the substrate 12, which does not insulate perfectly, the drain potential at the edge of the substrate 12 is also always present at the surface. The task of the edge area 41 is to decrease the voltage laterally between the source and the drain at the surface in a defined and reliable manner. In concrete terms this means that the equipotential lines 44 must be guided to the surface with a defined curvature. The important point here is that the allowable field strength may not be exceeded by the curvature of the equipotential lines 44. It is therefore advantageous to minimize the doping in the edge area.

In the case of the structure shown in FIG. 14, the edge area 41 is undoped or more weakly doped than the active area 40 or, generally speaking, the dopant profile in the edge area 41 differs from the dopant profile in the active area 40. At the transition between the active area 40 and the edge area 41, there is thus a transition area 43, which is characterized by a doping gradient. The field-stop layer 18 can be arranged only in the active area 40 and end at the transition area 43, or it could extend partially into the edge area 41, or it could extend completely over the edge area 41.

The structure of the edge area 41 (field plate edge) shown in FIG. 14 is only an example of other conceivable and known edge structures such as, for example, p-rings.

Another example of a semiconductor component 4 with a vertical structure according to the invention is illustrated in FIG. 15. Reference symbols which are the same as those in FIG. 13 designate identical elements.

The structure shown is a superjunction MOSFET, which has the same structure as the MOSFET in FIG. 13, but which also comprises p-doped pillars 16 or regions which are introduced to compensate for the n-doping of the drift zone 21 in the voltage-absorbing layer. On the right, the vertical and lateral dopant profiles are shown. The donor concentration in the lateral dopant profile is plotted in the upward direction, whereas the acceptor concentration is plotted in the downward direction. Reference numeral 45 designates a transition zone with a net doping of close to zero.

Many other semiconductor components 4 with a vertical structure can be produced by means of the method according to the invention.

The invention claimed is:

1. A method for the production of semiconductor components, which comprises the steps of:
   providing a substrate of semiconductor material with a thickness of 4 µm to 30 µm, wherein the step of providing the substrate is carried out by splitting a rod-shaped starting crystal of the semiconductor material into thin plates having the thickness of 4 µm to 30 µm; and
   producing a doped drift zone of the semiconductor component by means of ion implantation in the substrate using an ion beam passing through an energy filter, wherein the energy filter is a microstructured membrane with a predefined structural profile for setting a dopant depth profile and/or a defect depth profile produced in the substrate by the implantation, wherein producing the doped drift zone is carried out by two ion implantations from two opposite sides of the substrate, wherein, when the drift zone is produced, the entire drift zone is doped, and the entire drift zone is n-doped after the ion implantation;
   wherein the steps of providing the substrate and producing the drift zone are carried out completely without any epitactic deposition.

2. The method of claim 1, wherein the semiconductor material of the substrate is SiC.

3. The method of claim 1, wherein the semiconductor material of the substrate is undoped or weakly n-doped prior to producing the drift zone.

4. The method of claim 1, wherein the thickness of the substrate is between 4 and 25 µm.

5. The method of claim 1, wherein the drift zone extends over 100% of the height of the substrate.

6. The method of claim 1, wherein the substrate is rotated by 180° between the two implantations.

7. The method of claim 6, wherein first and second dopant profiles produced by the two ion implantations from the two opposite sides of the substrate each comprise a concentration plateau, wherein a first concentration plateau extends from a first edge area toward a middle area of the substrate and a second concentration plateau extends from a second edge area of the substrate opposite the first edge area also toward the middle area, and wherein each of the first and second dopant profiles also comprise a falling doping flank in a middle area of the substrate.

8. The method of claim 7, wherein the second concentration plateau assigned to the second edge area falls from the second edge area of the substrate toward the middle area of the substrate.

9. The method of claim 7, wherein the two doping flanks intersect in a middle area of the substrate, the two dopant profiles thus overlapping in the middle area.

10. The method of claim 1, wherein producing the doped drift zone is carried out with ions of nitrogen, phosphorus, or hydrogen as doping substance.

11. The method of claim 1, wherein a doped field-stop layer is produced at an edge area of the substrate by means of ion implantation using an energy filter.

12. The method of claim 11, wherein the field-stop layer is n-doped after the ion implantation, wherein the doping of the field-stop layer is stronger than the doping of the drift zone.

13. The method of claim 11, wherein the thickness of the field-stop layer is between 0.8 µm and 5 µm.

14. The method of claim 11, wherein the ion implantation for producing the field-stop layer is carried out from a side of the substrate on which the field-stop layer is to be formed.

15. The method of claim 1, wherein a superficial functional zone with areas of different dopings is produced by using ion implantation with an energy filter.

16. The method of claim 15, wherein a doped field-stop layer is produced at a second edge area of the substrate by means of ion implantation using an energy filter, and wherein the superficial functional zone lies at a first edge area of the substrate opposite the field-stop layer.

17. The method of claim 15, wherein the implantation of areas of the superficial functional zone is carried out from a side of the substrate on which the superficial functional zone is to be formed.

18. The method of claim 15, wherein the thickness of the superficial functional zone is between 0.5 µm and 6 µm.

19. The method of claim 1, wherein, in addition, p-doped areas or pillars are produced in areas of the drift zone by means of ion implantation using an energy filter.

20. The method of claim 15, wherein predefined areas of the substrate are masked during the ion implantation of at least the superficial functional zone.

21. The method of claim 19, wherein predefined areas of the substrate are masked during the ion implantation of at least the p-doped areas or pillars.

* * * * *